United States Patent [19]

Comer

[11] 4,168,528
[45] Sep. 18, 1979

[54] VOLTAGE TO CURRENT CONVERSION CIRCUIT

[75] Inventor: Donald T. Comer, Los Gatos, Calif.

[73] Assignee: Precision Monolithics, Inc., Santa Clara, Calif.

[21] Appl. No.: 926,845

[22] Filed: Jul. 21, 1978

[51] Int. Cl.$^2$ .......................... G06J 1/00; H03K 1/02; H03K 13/02
[52] U.S. Cl. .............................. 364/606; 307/296 R; 330/257; 307/229; 340/347 DA
[58] Field of Search ............... 364/606, 602, 600, 807, 364/841, 861; 307/296 R, 297, 229, 230, 350, 362; 330/257, 261, 252; 323/1, 4, 9, 23, 19; 340/347 DA

[56] References Cited

U.S. PATENT DOCUMENTS

| | | | |
|---|---|---|---|
| 3,634,659 | 1/1972 | Lucas et al. | 364/606 |
| 3,683,165 | 8/1972 | Grobert et al. | 364/606 |
| 3,717,777 | 2/1973 | Cecil | 307/296 R |
| 3,932,768 | 1/1976 | Takahashi et al. | 330/257 |
| 4,025,842 | 5/1977 | Crowle | 330/257 X |
| 4,045,694 | 8/1977 | Ahmed | 307/296 R |
| 4,100,436 | 7/1978 | Van de Plassche | 307/296 R |

OTHER PUBLICATIONS

Glaser et al—*Integrated Circuit Engineering*—Addison-Wesley Publishing Co., Reading, Mass., pp. 503-508, 1977.

Primary Examiner—Joseph F. Ruggiero
Attorney, Agent, or Firm—Poms, Smith, Lande & Rose

[57] ABSTRACT

A simplified temperature stabilized circuit provides a current which is proportional to a variable voltage by the use of branching transistor circuitry which fixes the voltage level of the supplied current, and controls its magnitude. The variable voltage is supplied through a reference resistor to the emitter of a first junction transistor having its base connected to the base of an identical junction transistor having its emitter grounded, thereby fixing the input voltage to the first transistor at a virtual ground potential. A third identical transistor has its base and emitter connected in parallel with the first transistor and carries an equal amount of current. Current derived in parallel from the first and second transistor is positively proportioned relative to the current flowing in the collector path of the third transistor by a pair of mirror-connected transistors having suitable relative areas and load resistors. The desired temperature stabilized current is applied from the bases of the mirrored transistors to the ladder network of a digital to analog converter. Two cascaded digital-to-analog circuits of this type provide a stable analog output voltage proportional to the product of the two numbers represented by the binary inputs.

13 Claims, 4 Drawing Figures

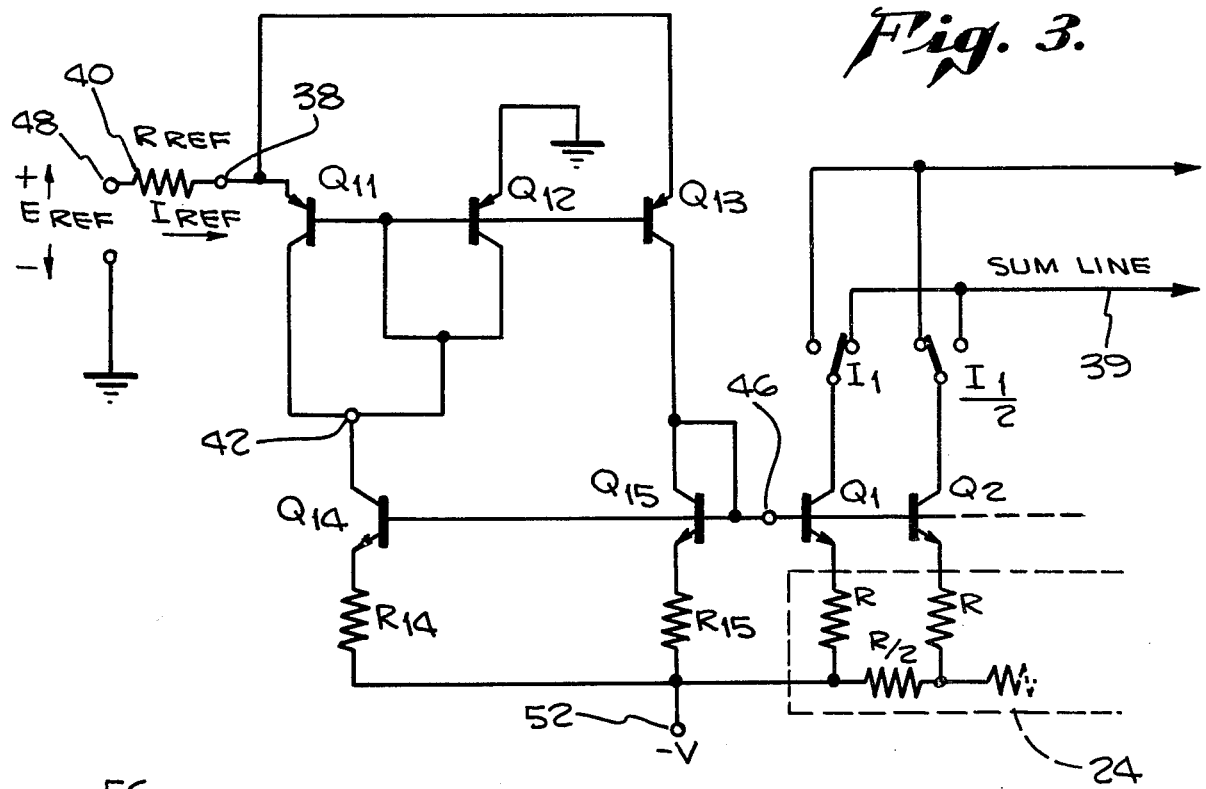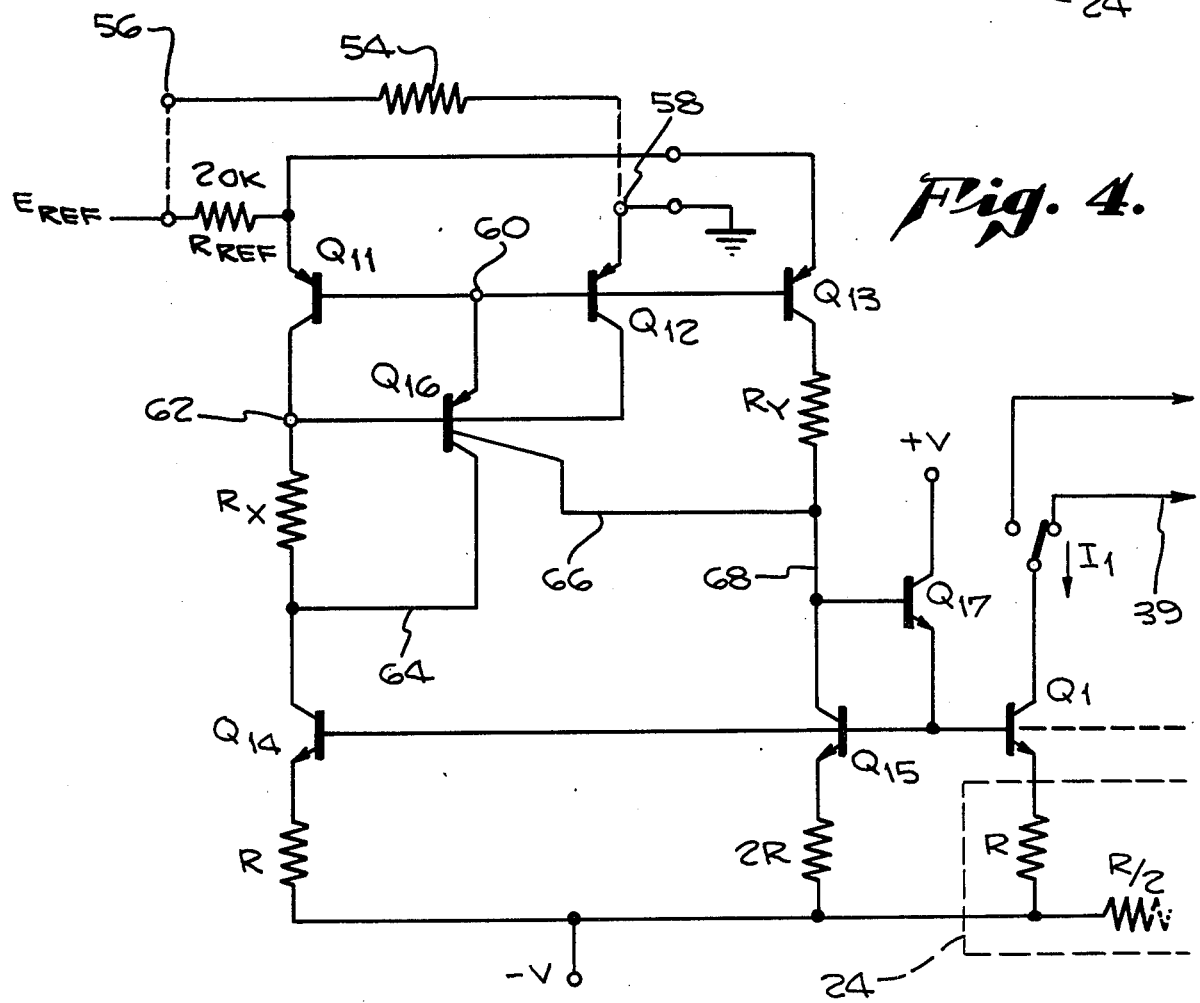

VOLTAGE TO CURRENT CONVERSION CIRCUIT

BACKGROUND OF THE INVENTION

This invention relates to electrical circuits for converting a variable input voltage to a corresponding proportional variable current, and for establishing the voltage level of the supplied current.

In the conversion of electrical signals representing digital information into analog electrical signals, it is customary to use ladder networks of resistances to establish the required binary weighting between the various currents corresponding to the input digital signals. Biasing current to the transistor controlled resistance ladder network is commonly provided by a voltage-to-current conversion circuit using an operational amplifier which creates a current in the ladder which is directly proportional to that of a voltage reference source. A typical prior art circuit for biasing a digital-to-analog resistance ladder is shown in FIG. 2 of the present drawings and will be discussed further below.

Disadvantages of such prior art circuits employing operational amplifiers are the relatively large number of devices required to implement the operational amplifier, and the problems arising from the associated compensation circuitry. Generally a compensation capacitor in the neighborhood of 20 to 80 picofarads is required in the operational amplifier. A capacitor of this size generally limits the rate at which the input voltage is allowed to change and still produce accurate analog signals. This shortcoming constitutes a particular limitation in digital-to-analog converters intended for high speed multiplication applications. The compensation circuitry also produces a transient problem even in fixed reference (non-multiplying) digital-to-analog converters. More specifically, the settling time of the output signal from the digital-to-analog converter, following changes in the binary input, is indirectly related to the settling time of the reference amplifier, since parasitic coupling paths normally cause small impulse excitation of the reference amplifier during switching transients.

Accordingly, a principal object of the present invention is to provide a current for biasing the ladder of a digital-to-analog converter, or for similar applications, which is strictly proportional to a reference voltage, and which provides this proportionality over a wide temperature range. Further, it is desirable that these properties be obtained while retaining the desirable features of an operational amplifier, including fixing of the voltage level of the supplied current.

Additional objects are to simplify and to reduce the settling time of digital to analog converters.

SUMMARY OF THE INVENTION

In accordance with the present invention, a reference voltage is supplied through an input reference resistor to the emitter of a transistor. In order to establish the voltage at the input of the first transistor at ground potential, a second identical transistor is provided with its emitter grounded and its base connected to the base of the first transistor. Current flowing from the collector of the first transistor is now summed with the current flowing through the second transistor. However, with the emitter of the first transistor having its path to ground including the emitter-to-base potential drop of one polarity and the base-to-emitter drop of the second transistor in the opposite polarity, the emitter of the first transistor is held at virtual ground potential, without its actually being connected to ground. The currents flowing through the first and second transistors are then summed. The input current from the input reference resistor is supplied to a third transistor which has its emitter and base electrodes in parallel to those of the first transistor. The input current therefore splits between the first and third transistors, and the current from the first transistor is combined with the current supplied through the second transistor as mentioned above. These two current paths (one from the third transistor, and the other from the first and second transistors) are connected respectively to two mirror-connected transistors having the necessary physical and circuit configuration to force the supplying of equal currents by the first and second transistors. The bases of the mirror connected transistors supply the desired output biasing current which is proportional to the input reference voltage.

It is also noted that, instead of establishing a virtual ground potential at the output of the reference resistor, another fixed potential level could be established at this point by the present circuitry.

An important application of the present invention is for the biasing of the ladder network of digital-to-analog converters, and the circuitry is particularly useful for use in digital-to-analog converters used in high speed multiplying.

Advantages of the improved circuit include an implementation which is much simpler than that utilizing an operational amplifier and which requires less area when implemented in an integrated circuit. In addition, no frequency compensation is required to stabilize the circuit against oscillation. Further, the circuit has a significantly faster response time than the operational amplifier circuit mentioned above.

Other objects, features, and advantages will become apparent from a consideration of the following detailed description and from the drawings.

DETAILED DESCRIPTION OF THE DRAWINGS

FIG. 3 is a circuit illustrating the principles of the present invention; and

FIG. 4 is a more sophisticated circuit embodying the principles of the present invention.

DETAILED DESCRIPTION

Figure 1:
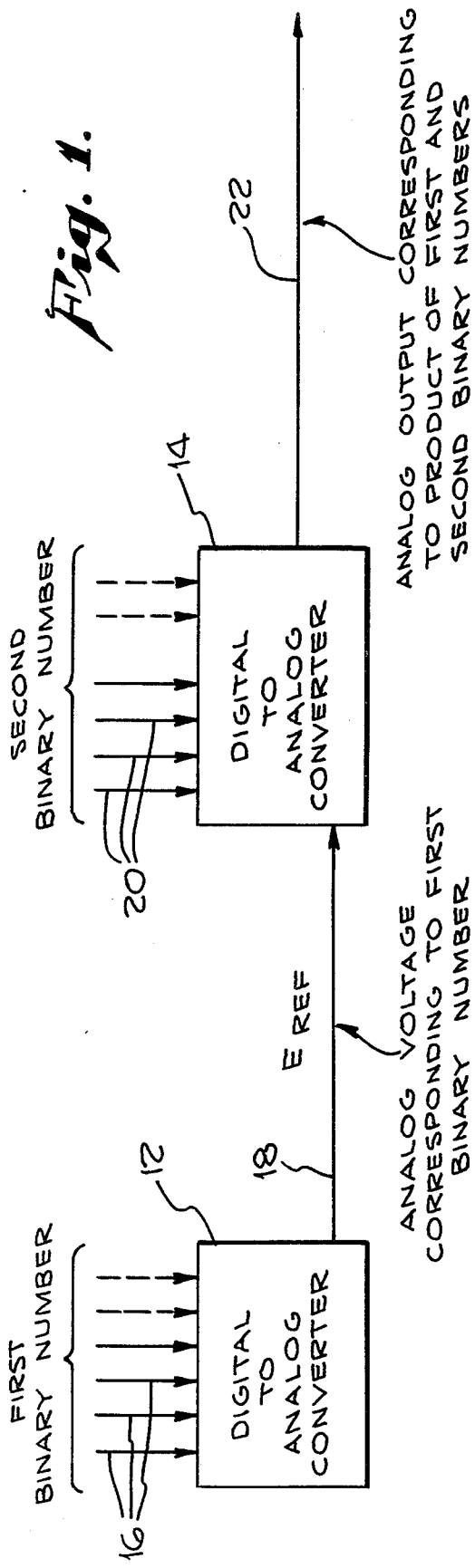
FIG. 1 is a block diagram indicating an overall circuit in which the detailed circuitry disclosed hereinafter may be employed.

With reference to the drawings, FIG. 1 shows a computer-type circuit including two digital-to-analog converters 12 and 14. Binary numbers are supplied to the digital-to-analog converter 12 as indicated by the inputs 16. An output voltage $E_{REF}$ appears on lead 18 interconnecting the digital-to-analog converter 12 with the converter 14. The level of the voltage $E_{REF}$ will be proportional to the magnitude of the binary number which is applied on the input leads 16 to the converter 12.

A second binary number is supplied to the converter 14 on leads 20. With a signal corresponding to the reference voltage being supplied to a weighting network of the type disclosed below, the output on lead 22 will be an analog signal which is proportional to the product of the first binary number applied on leads 16 and the second binary number applied on leads 20. Accordingly, the circuit shown in FIG. 1 is a high speed multiplier having a digital input and an analog output.

A widely used method of implementing digital-to-analog conversion employs a ladder network to establish the required binary weighting between the various bit currents, which are switched in accordance with the binary digits or "bits" which are present at the input signals. The biasing on the ladder network is commonly provided by a voltage-to-current conversion circuit which establishes a current in the ladder network which is directly proportional to a voltage reference source.

Figure 2:
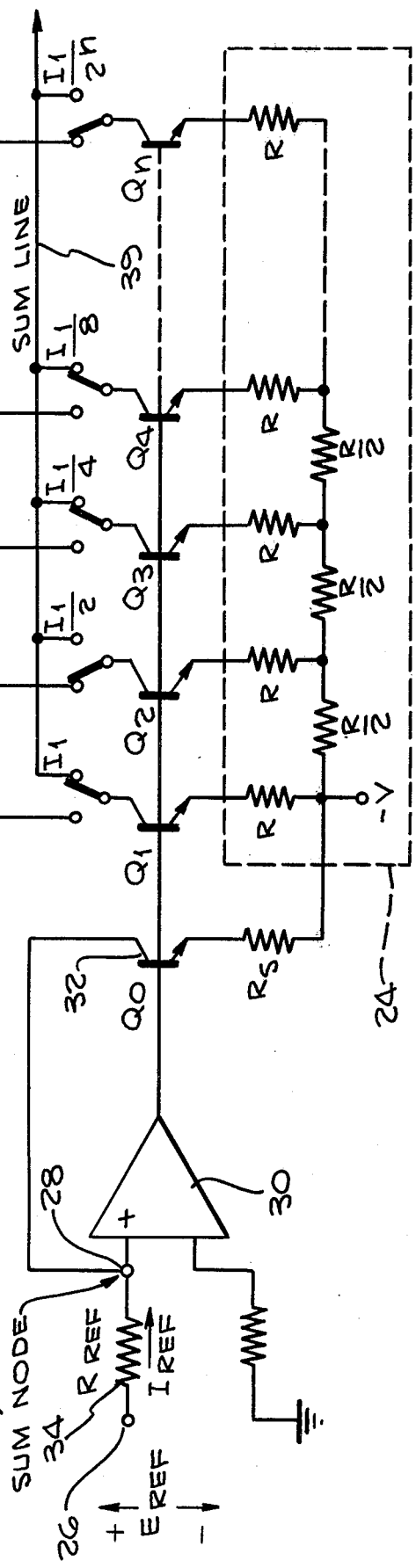
FIG. 2 is a prior art circuit applicable to digital-to-analog converters.

FIG. 2 illustrates a schematic circuit diagram showing a known method of accomplishing the biasing of a ladder network such as network 24 of FIG. 2 from a reference voltage $E_{REF}$ such as that applied to input terminal 26 of the circuit of FIG. 2. In FIG. 2, a sum node is created at the positive input 28 to the operational amplifier 30 by virtue of the negative feedback produced by the inversion of the output from the operational amplifier 30 by the transistor $Q_0$ and the subsequent feedback from the collector 32 of transistor $Q_0$ to the input terminal 28 of the operational amplifier 30. The resistor 34 is also designated $R_{REF}$ and is at the input to the operational amplifier terminal 28.

The current $I_{REF}$ flowing through the resistor $R_{REF}$ is given by the following formula:

$$I_{REF} = (E_{REF}/R_{REF}) \quad (1)$$

where $E_{REF}$ is the voltage applied to the input terminal 26, and $R_{REF}$ is the resistance of the designated input resistor.

In formula (1), it is assumed that the sum node at point 28 is a virtual ground. If the input bias current to the operational amplifier 30 is assumed to be negligibly small, then the current in the collector 32 of transistor $Q_0$ will be equal to $I_{REF}$ and the current $I_1$ in the collector circuit of transistor $Q_1$ will be directly proportional to $I_{REF}$ with transistors $Q_0$ and $Q_1$ being viewed as a precision current mirror and with the ratio of $I_1$ to $I_{REF}$ being determined by the ratio of $R_S$ to R and the relative emitter scalings or areas of transistors $Q_0$ and $Q_1$. Typical element values used in actual designs might involve a reference voltage $E_{REF}$ having a maximum value of approximately 10 volts, $R_{REF} = 20,000$ ohms, (or 20K); $R_S = 8K$, $R = 4K$, and $R/2 = 2K$, with the letter K standing for thousands of ohms in reference to resistor values, and with the area of the emitter of transistor $Q_1$ scaled to be twice that of transistor $Q_0$. These typical values would result in $I_{REF}$ equal to about 0.5 ma (milliampere) and $I_1 = 1$ ma, with equal current densities in both transistors $Q_0$ and $Q_1$.

In FIG. 2, the current ladder 24 including the network of resistors R and R/2 is conventional. Current flows continuously through the transistors $Q_0$, $Q_1$, $Q_2$, $Q_3$... $Q_n$, with the current through each successive transistor $Q_1$, $Q_2$, $Q_3$... $Q_n$ being equal to $I_1$, $I_1/2$, $I_1/4$, $I_1/8$... $I_1/2^n$. The binary input to the digital-to-analog converter of FIG. 2 is provided by switches, shown schematically in FIG. 2 by the mechanical switches $S_1$, $S_2$, $S_3$... $S_n$, with the state of the successive switches corresponding to the successive digits of the input binary number.

Instead of the mechanical switches shown in FIG. 2, transistor switching circuitry is normally employed, of course. An analog representation of the input digital signal is developed in terms of the summation of currents flowing through selected transistors $Q_1$, $Q_3$ and $Q_4$, for example which are directed by the switches to flow through the sum output lead 39. As the input voltage $E_{REF}$ changes, the biasing current to all of the transistors $Q_1$, $Q_2$ etc. changes, and the binary currents shift correspondingly, while still retaining their binary weighting relative to one another.

The circuit of FIG. 2 provides two important functions. First, the current $I_1$ and the subsequent binary multiples are all directly proportional to the voltage $E_{REF}$. Secondly, the effect of temperature is compensated as long as the emitter-to-base voltages of transistors $Q_0$ and $Q_1$ do not change significantly with respect to one another with changes in temperature, and as long as the sum node 28 remains a virtual ground. And this last proviso will be maintained, as long as the offset voltage temperature coefficient of the operational amplifier 30 is not unduly large. As mentioned above, the circuit of FIG. 2 does have the disadvantage that a relatively large number of devices are required to implement the operational amplifier and the associated compensation circuitry. Further, the size of the compensation capacitor, which is normally equal to approximately 20 to 80 picofarads, will limit the slew rate of the amplifier and the corresponding speed at which $E_{REF}$ is permitted to change while maintaining the required output accuracy from the unit.

The present invention as described below in connection with FIGS. 3 and 4, maintains the two important functions of the circuit of FIG. 2, while alleviating the main disadvantages.

FIG. 3 illustrates a basic form of the circuit of the present invention. The arrangement of FIG. 3 provides that the point 38 between the input resistor 40 ($R_{REF}$) and the emitter of transistor $Q_{11}$ will set at approximately ground potential for any value of $E_{REF}$, in a manner similar to point 28 at the input to the operational amplifier 30 in FIG. 2.

In the following analysis it will be initially assumed that all transistor base-to-collector gains $\beta$ are very large. The fact that base currents are finite may be corrected by subsequent minor additions to the circuit as discussed below.

$$I_{REF} = (E_{REF} - V_{be1} + V_{be2})/R_{REF} \quad (2)$$

where $V_{be1}$ and $V_{be2}$ are respectively the base-emitter voltage drops of transistors $Q_{11}$ and $Q_{12}$.

The current $I_{REF}$ is split equally at the emitters of $Q_{11}$ and $Q_{13}$, assuming that $Q_{11}$ and $Q_{13}$ are identical devices. Thus, neglecting base current error, the current at the collector of transistor $Q_{13}$ will be $I_{REF}/2$.

$Q_{15}$ and $Q_{14}$ form a precision current mirror, having a factor of 2, with the emitter area of transistor $Q_{14}$ being twice as large of that of transistor $Q_{15}$, and resistor $R_{14}$ being one-half the value of resistor $R_{15}$. The mirror arrangement of transistors $Q_{14}$ and $Q_{15}$ forces equal current densities through the two transistors, and accordingly forces twice the current through transistor $Q_{14}$ as through transistor $Q_{15}$. The current at the collector of transistor $Q_{11}$ is $I_{REF}/2$ by virtue of the equal split of the emitter currents flowing through transistors $Q_{11}$ and $Q_{13}$. Accordingly, in order to satisfy the requirements of Kirchoff's current law at node 42, the collector of transistor $Q_{12}$ must supply a current equal to $I_{REF}/2$. The mirror arrangement of transistors $Q_{14}$ and $Q_{15}$ has therefore forced identical currents through the emitters of transistors $Q_{11}$ and $Q_{12}$. With transistors $Q_{11}$ and $Q_{12}$ being identical devices, then at equal currents their base-to-emitter voltages will be equal. That is, the following relationship will obtain:

$$V_{be1} = V_{be2} \qquad (3)$$

Then, from equation 2 the current $I_{REF}$ becomes:

$$I_{REF} = (E_{REF}/R_{REF}) \qquad (4)$$

It may be noted that this relationship is identical to that of equation (1) for the circuit of FIG. 2.

The ladder network of resistances 24, the current control transistors $Q_1$, $Q_2$ etc., and the switching circuitry for FIG. 3 is the same as that described above in connection with FIG. 2. The current bias supplied to point 46 will vary proportionally to the input voltage $E_{REF}$ supplied to the terminals 48 and 50 at the input to the circuit of FIG. 3.

To indicate the order of magnitude of typical voltages which might be present in the circuit of FIG. 3, the input voltage $E_{REF}$ might typically range from 0 to 10 volts depending on the output of the previous digital-to-analog converter 12 (see FIG. 1). The negative voltage supplied to terminal 52 may be minus 15 volts. The voltage drop across resistor R in the emitter circuit of transistor $Q_1$ may be about 4 volts maximum. With R being taken equal to 4,000 ohms, the current $I_1$ may be about 1 milliampere. For the mirror-connected transistors $Q_{14}$ and $Q_{15}$, in order for transistor $Q_{14}$ to carry twice as much current as transistor $Q_{15}$ the emitter area of transistor $Q_{14}$ is twice that of transistor $Q_{15}$, and the resistance of resistor $R_{14}$ associated with transistor $Q_{14}$ is half that of resistance $R_{15}$. The relative magnitudes of the resistors $R_{14}$ and $R_{15}$, and that of the resistors in the ladder network including resistor R in the emitter circuit of transistor $Q_1$ may be chosen for appropriate division of current, and more specifically, $R_{14}$ may be chosen to be equal to R, with the resistance of resistor $R_{15}$ therefore being equal to 2R.

Instead of having $Q_{11}$ and $Q_{13}$ identical, as discussed above, the emitter areas of these two transistors may be varied, with transistor $Q_{13}$ drawing several times the current of transistor $Q_{11}$, for example. The configuration of the mirror connected transistors $Q_{14}$ and $Q_{15}$ and their associated resistors would then be varied, to still force twice the current flow through transistor $Q_{14}$ as through $Q_{11}$ so that the transistor $Q_{12}$ (still identical to transistor $Q_{11}$) will carry equal current, to produce the desired virtual ground at point 38.

Also, if desired, or if other circuit parameters make it desirable, the emitter of transistor $Q_{12}$ may be fixed at some constant voltage level other than ground. Then, point 38 will not be at a virtual ground potential, but at the constant voltage level of the emitter of transistor $Q_{12}$.

FIG. 4 shows a further implementation of the basic circuit of FIG. 3, and includes the emitter followers $Q_{16}$ and $Q_{17}$ to reduce the base current errors introduced by the fact that the base-collector gain $\beta$ of all devices is finte. In addition, the resistors $R_x$ and $R_y$ are included to provide a voltage drop so that the collector potentials of the current mirror elements $Q_{11}$–$Q_{13}$, and $Q_{14}$–$Q_{15}$ more closely match.

The implementation shown in FIG. 4 shows an important feature in the use of the split collectors on transistor $Q_{16}$ to compensate for the base current loss of transistors $Q_{11}$, $Q_{12}$ and $Q_{13}$. The base current is in essence summed back into the collector outputs to keep current levels independent of the lateral PNP collector gain factor B, as long as all units track, or maintain their relative operating characteristics with varying temperature.

In FIG. 4, the resistor 54 may be provided with the terminal 56 to provide a high impedance negative input terminal, and its other terminal connected to point 58, the grounded emitter of transistor $Q_{12}$. By locating the optional resistor 54 having a resistance value equal to 40K, twice that of $R_{REF}$, as indicated by the dashed lines in FIG. 4, emitter current is supplied to $Q_{12}$ and a high impedance node is created at point 58, as far as the external connection is concerned.

Concerning currents in various circuit branches of FIG. 4, they are estimated to be as follows. The emitter current to transistors $Q_{11}$ and $Q_{13}$ from $R_{REF}$ is approximately one-half milliampere, or 0.250 microamp each; base current of $Q_{12}$ to point 60, about 10 microamperes; base current of transistor $Q_{11}$ to point 60, about 5 microamperes; emitter current to $Q_{16}$, about 15 microamperes; collector current from $Q_{13}$, about 245 microamperes; base current from transistor $Q_{16}$ to point 62, about 245 microamperes; current in lead 64, about 10 microamperes; current in lead 66, about 5 microamperes; current in lead 68, about 250 microamperes; and current to collector of transistor $Q_{14}$, about 500 microamperes.

In summary, relative to the present invention, it has the advantages, as compared with the circuit of FIG. 2, that (1) the implementation is much simpler, and requires less integrated circuit chip area; (2) no frequency compensation is required to stabilize the circuit against oscillation; and (3) the circuit has a faster time response.

For completeness, it is noted that so-called "current mirrors" have been described in a number of texts, and one such text disclosing some mirror circuits is "Integrated Circuit Engineering", by Arthur B. Glaser et al., Addison-Wesley Publishing Co., Reading, Mass., 1977.

In closing, it is to be understood that the above-described preferred embodiments are merely illustrative of the principles of the invention. Thus, by way of example and not of limitation, mirror circuit modifications, or the use of other components to accomplish specific disclosed functions, are within the contemplation of the invention. Accordingly, the present invention is not to be limited to the specific disclosed and described embodiments.

What is claimed is:

1. An improved multiplier circuit for providing an analog output signal which is proportional to the product of two binary numbers including:
   a first digital-to-analog converter means for receiving a binary input and for producing a reference output voltage proportional to the binary input;
   a second digital-to-analog converter, said second digital-to-analog circuit including an input reference resistor;
   a current ladder means including a plurality of transistors for controlling the magnitude of current flow at successive binary digit flow points in said ladder in accordance with the reference output voltage applied to said reference resistor from said first digital-to-analog converter,
   wherein the improvement involves an improved circuit for biasing said ladder current control transistors comprising:

first and second transistors connected to receive current in parallel from said reference resistor;

third and fourth mirror connected transistors connected respectively in series with said first and second transistors to insure substantially proportional flow of current in the two parallel paths including said first and third, and said second and fourth transistors;

means including a fifth transistor having its emitter-to-base circuit connected from a fixed voltage level to the emitter-to-base circuit of said first transistor and its collector to the collector of said first transistor, to hold the output from said reference resistor virtually at said fixed voltage level; and means for supplying bias current from the bases of said mirror-connected third and fourth transistors to said ladder current control transistors.

2. A circuit as defined in claim 1 wherein said fixed voltage level is ground, whereby the potential of the circuit point between said reference resistor and said first and second transistors is a virtual ground.

3. A circuit as defined in claim 1 wherein the base and collector of said fourth transistor are connected together.

4. A circuit as defined in claim 1 wherein means are provided for supplying current to the collector of said third transistor from both said first and fifth transistors, and wherein the bases of said third and fourth transistors are connected together.

5. A circuit as defined in claim 1 wherein resistance means are provided for equalizing the potential at the collectors of said third and fourth transistors.

6. A circuit as defined in claim 4 further comprising means including emitter follower connected transistors for compensating for base current loss of said other transistors.

7. An improved transistor circuit for providing an electrical signal which is proportional to an applied input signal comprising:

means for providing a reference input voltage;
a load circuit;
an input reference impedance coupled to receive said input voltage;

first and second transistors connected to receive current in parallel from said reference impedance;

third and fourth mirror connected transistors connected respectively in series with said first and second transistors to insure substantially proportional flow of current in the two parallel paths including said first and third, and said second and fourth transistors;

means including a fifth transistor having its emitter-to-base circuit connected from a fixed voltage level to the emitter-to-base circuit of said first transistor and its collector to the collector of said first transistor, to hold the output from said reference resistor virtually at said fixed voltage level; and means for supplying current from said mirror-connected third and fourth transistors to said load circuit.

8. A circuit as defined in claim 7 wherein said fixed voltage level is ground, whereby the potential of the circuit point between said reference impedance and said first and second transistors is a virtual ground.

9. A circuit as defined in claim 7 wherein the base and collector of said fourth transistor are connected together.

10. A circuit as defined in claim 7 wherein means are provided for supplying current to the collector of said third transistor from both said first and fifth transistors, and wherein the bases of said third and fourth transistors are connected together.

11. A circuit as defined in claim 7 wherein resistance means are provided for equalizing the potential at the collectors of said third and fourth transistors.

12. A circuit as defined in claim 10 further comprising means including emitter follower connected transistors for compensating for base current loss of said other transistors.

13. A circuit as defined in claim 7 wherein the bases of said first and fifth transistors are connected together, the emitter of said first transistor is connected to said input reference impedance, and the emitter of said fifth transistor is connected to ground.

* * * * *